US011862606B2

(12) United States Patent
Yu et al.

(10) Patent No.: US 11,862,606 B2
(45) Date of Patent: *Jan. 2, 2024

(54) PACKAGES WITH METAL LINE CRACK PREVENTION DESIGN

(71) Applicant: Taiwan Semiconductor Manufacturing Co., Ltd., Hsinchu (TW)

(72) Inventors: Chen-Hua Yu, Hsinchu (TW); Shin-Puu Jeng, Po-Shan Village (TW); Der-Chyang Yeh, Hsinchu (TW); Hsien-Wei Chen, Hsinchu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

This patent is subject to a terminal disclaimer.

(21) Appl. No.: 17/361,791

(22) Filed: Jun. 29, 2021

(65) Prior Publication Data

US 2021/0327854 A1 Oct. 21, 2021

Related U.S. Application Data

(63) Continuation of application No. 15/914,102, filed on Mar. 7, 2018, now Pat. No. 11,056,464, which is a (Continued)

(51) Int. Cl.
*H01L 25/065* (2023.01)
*H01L 23/538* (2006.01)
(Continued)

(52) U.S. Cl.
CPC ........ *H01L 25/0657* (2013.01); *H01L 23/481* (2013.01); *H01L 23/50* (2013.01);
(Continued)

(58) Field of Classification Search
CPC ............... H01L 25/0657; H01L 23/481; H01L 23/3128; H01L 24/32; H01L 24/48;
(Continued)

(56) References Cited

U.S. PATENT DOCUMENTS 8,047,421 B2 11/2011 Sri-Jayantha et al.
8,829,663 B2 9/2014 Pohl et al.
(Continued)

FOREIGN PATENT DOCUMENTS

CN 101261974 A 9/2008
CN 102315136 A 1/2012

*Primary Examiner* — Mohammad M Choudhry
(74) *Attorney, Agent, or Firm* — Slater Matsil, LLP

(57) ABSTRACT

A package includes a corner, a device die, a plurality of redistribution lines underlying the device die, and a plurality of metal pads electrically coupled to the plurality of redistribution lines. The plurality of metal pads includes a corner metal pad closest to the corner, wherein the corner metal pad is a center-facing pad having a bird-beak direction substantially pointing to a center of the package. The plurality of metal pads further includes a metal pad farther away from the corner than the corner metal pad, wherein the metal pad is a non-center-facing pad having a bird-beak direction pointing away from the center of the package.

19 Claims, 12 Drawing Sheets

Related U.S. Application Data continuation of application No. 14/244,111, filed on Apr. 3, 2014, now Pat. No. 9,929,126.

(51) Int. Cl.
| | | |
|---|---|---|
| *H01L 23/00* | (2006.01) | |
| *H01L 25/10* | (2006.01) | |
| *H01L 23/50* | (2006.01) | |
| *H01L 23/48* | (2006.01) | |
| *H01L 23/31* | (2006.01) | |

(52) U.S. Cl.
CPC ...... *H01L 23/5386* (2013.01); *H01L 23/5389* (2013.01); *H01L 24/09* (2013.01); *H01L 24/17* (2013.01); *H01L 24/19* (2013.01); *H01L 24/20* (2013.01); *H01L 25/105* (2013.01); H01L 23/3128 (2013.01); H01L 23/562 (2013.01); H01L 24/32 (2013.01); H01L 24/48 (2013.01); H01L 24/73 (2013.01); H01L 2224/02372 (2013.01); H01L 2224/0401 (2013.01); H01L 2224/04042 (2013.01); H01L 2224/04105 (2013.01); H01L 2224/0912 (2013.01); H01L 2224/12105 (2013.01); H01L 2224/16145 (2013.01); H01L 2224/16227 (2013.01); H01L 2224/32225 (2013.01); H01L 2224/48091 (2013.01); H01L 2224/48227 (2013.01); H01L 2224/73265 (2013.01); H01L 2224/73267 (2013.01); H01L 2224/81385 (2013.01); H01L 2225/06513 (2013.01); *H01L 2225/06517* (2013.01); *H01L 2225/06548* (2013.01); *H01L 2225/1035* (2013.01); *H01L 2225/1041* (2013.01); *H01L 2225/1058* (2013.01); *H01L 2924/00014* (2013.01); *H01L 2924/14* (2013.01); *H01L 2924/1431* (2013.01); *H01L 2924/15311* (2013.01); *H01L 2924/181* (2013.01)

(58) Field of Classification Search
CPC .......... H01L 24/73; H01L 2224/32225; H01L 2224/48091; H01L 2924/181
See application file for complete search history.

(56) References Cited

U.S. PATENT DOCUMENTS

| | | | |
|---|---|---|---|
| 9,929,126 B2 | 3/2018 | Yu et al. | |
| 2005/0287829 A1* | 12/2005 | Ichikawa | H05K 3/3436 |
| | | | 439/66 |
| 2007/0075423 A1 | 4/2007 | Ke et al. | |
| 2008/0116537 A1 | 5/2008 | Adkisson et al. | |
| 2010/0072606 A1 | 3/2010 | Yang | |
| 2011/0084390 A1 | 4/2011 | Chen | |
| 2011/0215453 A1* | 9/2011 | Eng | H01L 24/20 |
| | | | 257/E25.027 |
| 2012/0146231 A1 | 6/2012 | Meyer et al. | |
| 2013/0280826 A1* | 10/2013 | Scanlan | H01L 24/03 |
| | | | 438/15 |

* cited by examiner

PACKAGES WITH METAL LINE CRACK PREVENTION DESIGN

PRIORITY CLAIM AND CROSS-REFERENCE

This application is a continuation of U.S. patent application Ser. No. 15/914,102, entitled "Packages with Metal Line Crack Prevention Design," filed on Mar. 7, 2018, which is a continuation of U.S. patent application Ser. No. 14/244,111, entitled "Packages with Metal Line Crack Prevention Design," filed on Apr. 3, 2014, now U.S. Pat. No. 9,929,126 issued Mar. 27, 2018, which applications are incorporated herein by reference.

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package is formed first, which includes a device die bonded to a package substrate. A molding compound is molded on the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
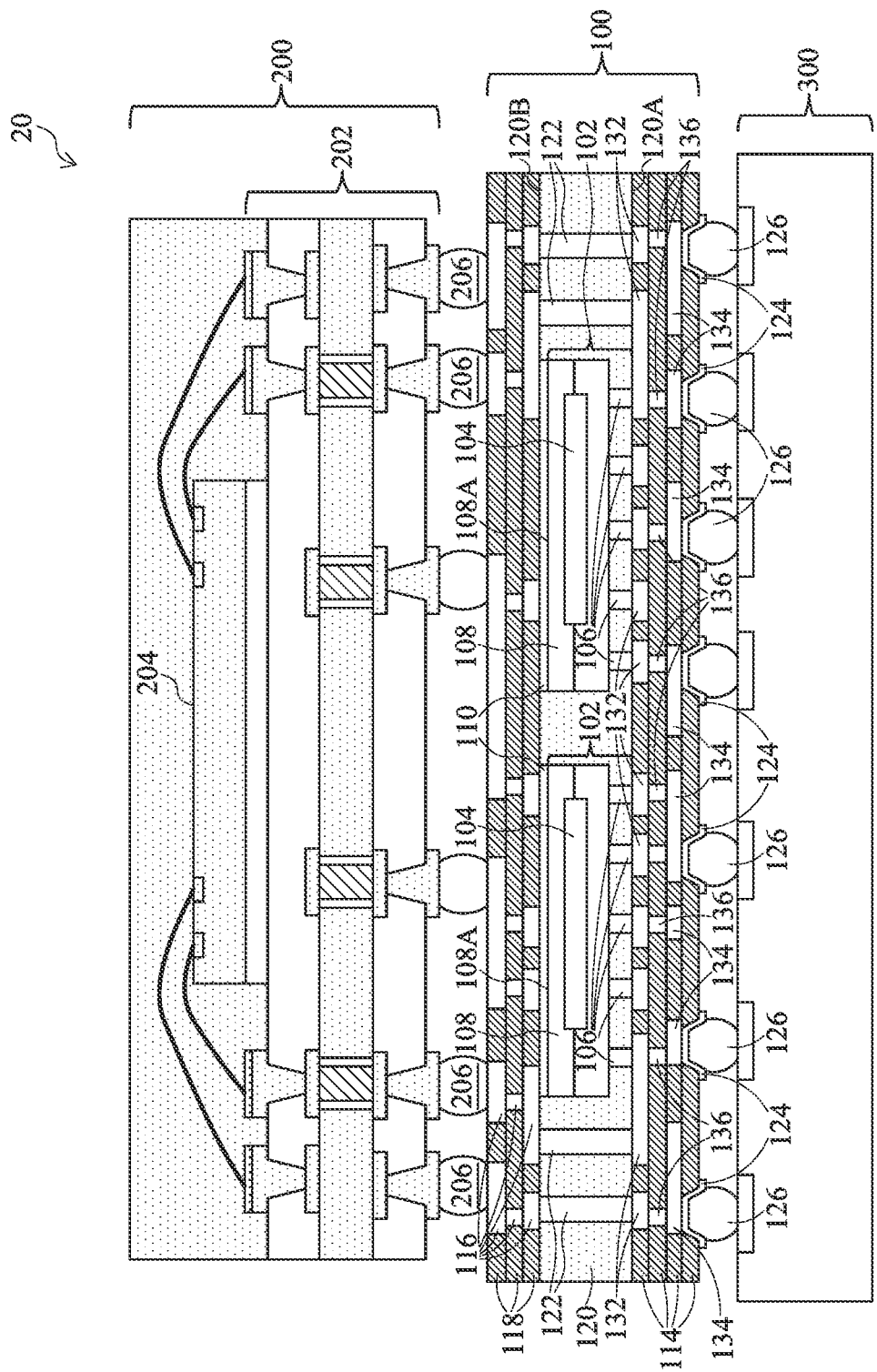
FIG. 1 illustrates a cross-sectional view of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package are provided in accordance with various exemplary embodiments. The variations of the embodiments are discussed. Throughout the various views and illustrative embodiments, like reference numbers are used to designate like elements.

FIG. 1 illustrates a cross-sectional view of package 20 in accordance with some embodiments. Package 20 includes package 100 and package 200 over and bonded to package 100. In some embodiments, package 100 includes device dies 102, with the front sides of device dies 102 facing down and bonded to Redistribution Layers (RDLs) 132/134/136. Throughout the description, the term "RDL" also refers to the redistribution lines in the redistribution layers. In alternative embodiments, package 100 includes a single device die or more than two device dies. Device die 102 may include semiconductor substrate 108, and integrated circuit devices 104 (such as active devices, which include transistors, for example) at the front surface (the surface facing down) of semiconductor substrate 108. Device die 102 may include a logic die such as a Central Processing Unit (CPU) die, a Graphic Processing Unit (GPU) die, a mobile application die, or the like.

Device dies 102 are molded in molding material 120, which surrounds each of device dies 102. Molding material 120 may be a molding compound, a molding underfill, a resin, or the like. The bottom surface 120A of molding material 120 may be level with the bottom ends of device dies 102. The top surface 120B of molding material 120 may be level with or higher than back surface 108A of semiconductor substrate 108. In some embodiments, back surface 108A of semiconductor substrate 108 is overlapped by die-attach film 110, which is a dielectric film adhering device die 102 to the overlying dielectric layer 118. Device die 102 further includes metal pillars/pads 106 (which may include copper pillars, for example) in contact with, and bonded to, RDLs 132.

Package 100 may include bottom-side RDLs 132/134/136 underlying device dies 102, and top-side RDLs 116 overlying device dies 102. Bottom-side RDLs 132/134/136 are formed in dielectric layers 114, and top-side RDLs 116 are formed in dielectric layers 118. RDLs 132/134/136 and 116 may be formed of copper, aluminum, nickel, titanium, alloys thereof, or multi-layers thereof. In some embodiments, dielectric layers 114 and 118 are formed of organic materials such as polymers, which may further include polybenzoxazole (PBO), benzocyclobutene (BCB), polyimide, or the like. In alternative embodiments, dielectric layers 114 and 118 are formed of inorganic material such as silicon oxide, silicon nitride, silicon oxynitride, or the like.

Through-Vias 122 are formed to penetrate through molding material 120. In some embodiments, through-vias 122 have top surfaces level with the top surface 120B of molding material 120, and bottom surfaces level with the bottom surface 120A of molding material 120. Through-Vias 122 electrically couple bottom-side RDLs 132/134/136 to top-side RDLs 116. Through-Vias 122 may also be in physical contact with bottom-side RDLs 132 and top-side RDLs 116.

Electrical connectors 124, which are formed of a non-solder metallic material(s), are formed at the bottom surface of package 100. In some embodiments, electrical connectors 124 include Under-Bump Metallurgies (UBMs), which are also metal pads. In alternative embodiments, electrical connectors 124 are metal pads, metal pillars, or the like. Metal pads 124 may comprise copper, aluminum, titanium, nickel, palladium, gold, or multi-layers thereof. In some embodiments, the bottom surfaces of metal pads 124 extend below the bottom surface of the bottom dielectric layer 114, as shown in FIG. 1. Solder regions 126 may be attached to the bottom surfaces of metal pads 124.

In some embodiments, RDLs 132/134/136 include portions (including 132 and 134) in more than one metal layers and vias 136 interconnecting the RDLs in different metal layers. For example, FIG. 1 illustrates RDLs 132, which are closest to through-vias 122. The bottom surfaces of through-vias 122 are in contact with some of RDLs 132. Furthermore, metal pillars 106 of device die 102 are also in contact with some of RDLs 132. Electrical connectors 124 are electrically coupled to, and may be in physical contact with, RDLs 134. Hence, RDLs 134 may be in the metal layer that is closest to electrical connectors 124. Vias 136 are disposed between, and electrically interconnect, RDLs 132 and RDLs 134.

Figure 2:
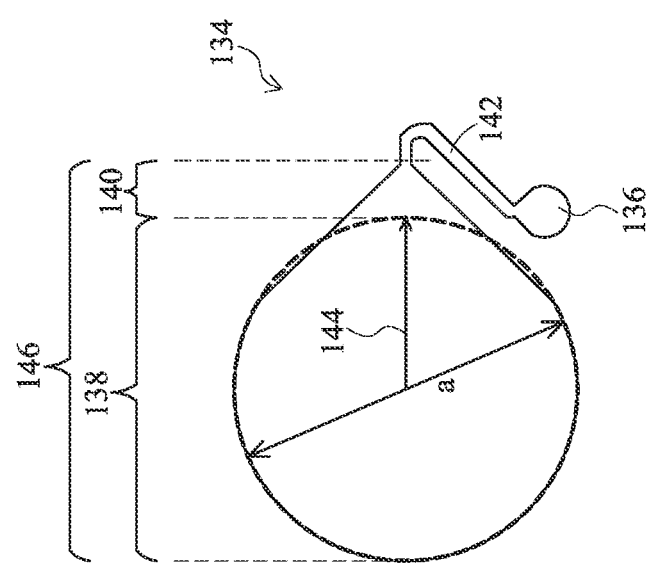
FIG. 2 illustrates a bottom view of a Redistribution layer (RDL) pad in accordance with some embodiments, wherein the RDL pad includes a main pad region and a bird-beak region connected to the main pad region.

FIG. 2 illustrates a bottom view of one of RDLs 134. The illustrated RDL 134 includes main pad region 138, metal trace 142, and bird-beak region 140 connecting main pad region 138 to metal trace 142. In accordance with some embodiments, main pad region 138 has a round bottom-view shape. In alternative embodiments, main pad region 138 may have other applicable shapes including, and not limited to, rectangles, hexagons, octagons, and the like. bird-beak region 140 is the region that has widths gradually and/or continuously transition from the width of main pad region 138 to the width of metal trace 142. Metal trace 142 has one end connected to one of vias 136, which leads to RDLs 132 (FIG. 1).

Arrow 144 is drawn to show the direction pointing from the center of main pad region 138 to the center (FIGS. 3, 4, and 6-8) of bird-beak region 140. Direction 144 may also point from the center of main pad region 138 to the connecting point between bird-beak region 140 and metal trace 142. Main pad region 138 and bird-beak region 140 in combination form an RDL pad 146 for supporting and connecting to electrical connector 124 (FIG. 1). Throughout the description, direction 144 is referred to the bird-beak direction of the respective RDL pad 146 and the bird-beak direction of the respective RDL 134.

Figure 3:
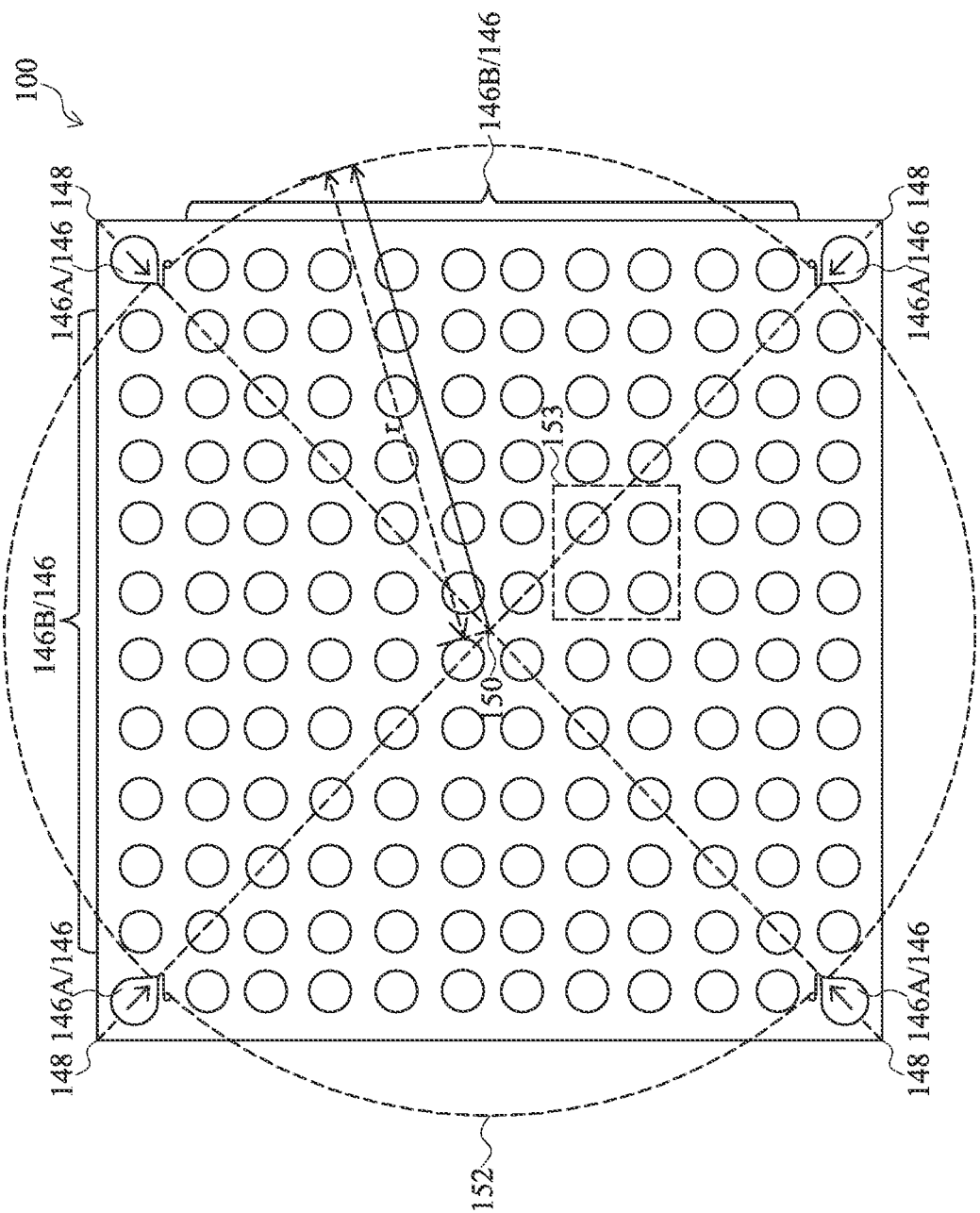
FIGS. 3 and 4 illustrate bottom views of packages and RDL pads in accordance with some embodiments, wherein center-facing pads and randomly-pointed RDL pads are distributed depending on their distances to neutral-stress points of the packages.

FIG. 3 illustrates an exemplary bottom view of bottom package 100, wherein RDL pads 146 (and some of RDL traces) are illustrated. RDLs 134 include center-facing pads (sometimes referred to as center-facing metal pads hereinafter) 146A and randomly-pointed pads 146B. In FIGS. 3 through 9J, circles are used to schematically represent randomly-pointed RDL pads 146B. Center-facing pads 146A, however, are illustrated with more details to indicate their bird-beak directions. For example, the main pad region, the bird-beak region, and the respective bird-beak direction of center-facing pads 146A are schematically illustrated.

Figure 5:
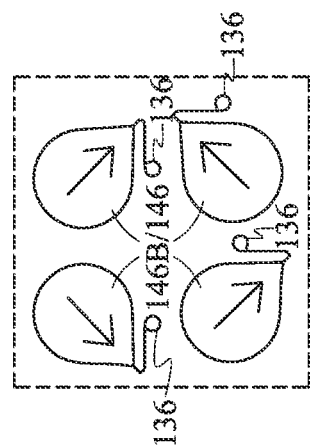
FIG. 5 illustrates a bottom view of some randomly-pointed RDL pads in accordance with some embodiments.

FIG. 5 illustrates the bottom views (or top views) of exemplary randomly-pointed RDL pads 146B with more details, wherein the randomly-pointed RDL pads 146B are shown in FIGS. 3, 4, and 6 through 9J. FIG. 5 schematically illustrate an inner region 153 (also refer to FIGS. 3 and 4) of package 100 and the randomly-pointed RDL pads 146B therein. As shown in FIG. 5, randomly-pointed RDL pads 146B may have the similar shapes as center-facing pads 146A. For example, randomly-pointed RDL pads 146B may also include main pad regions, and bird-beak regions connected to the respective main pad regions. There are also metal traces connected to the bird-beak regions, with the metal traces further connected to vias 136.

As shown in FIG. 5, the bird-beak directions of randomly-pointed RDL pads 146B are randomly disposed, and can be in any directions. Therefore, each of the bird-beak directions of randomly-pointed pads 146B may be in any direction, including center-facing and non-center-facing. For example, the bird-beak directions of randomly-pointed RDL pads 146B do not necessarily point to the center of package 100 (FIGS. 1 and 3), and do not necessarily point to the center of any device die in package 100. Furthermore, neighboring randomly-pointed RDL pads 146B may have different bird-beak directions.

Referring back to FIG. 3, bottom package 100 includes four corners 148. The corner RDL pads 146, which are closer to the respective corners 148 than all other metal pads, are center-facing pads 146A, which have their bird-beak directions pointing to (or substantially pointing to) center 150 of package 100. Other RDL pads 146 that are farther away from the respective corners 148 than the corner RDL pads 146A are randomly-pointed RDL pads 146B. In some embodiments, there may be more than one center-facing pad 146A at each corner 148. For example, FIG. 4 illustrates three center-facing pads 146A at each corner 148.

Figure 4:
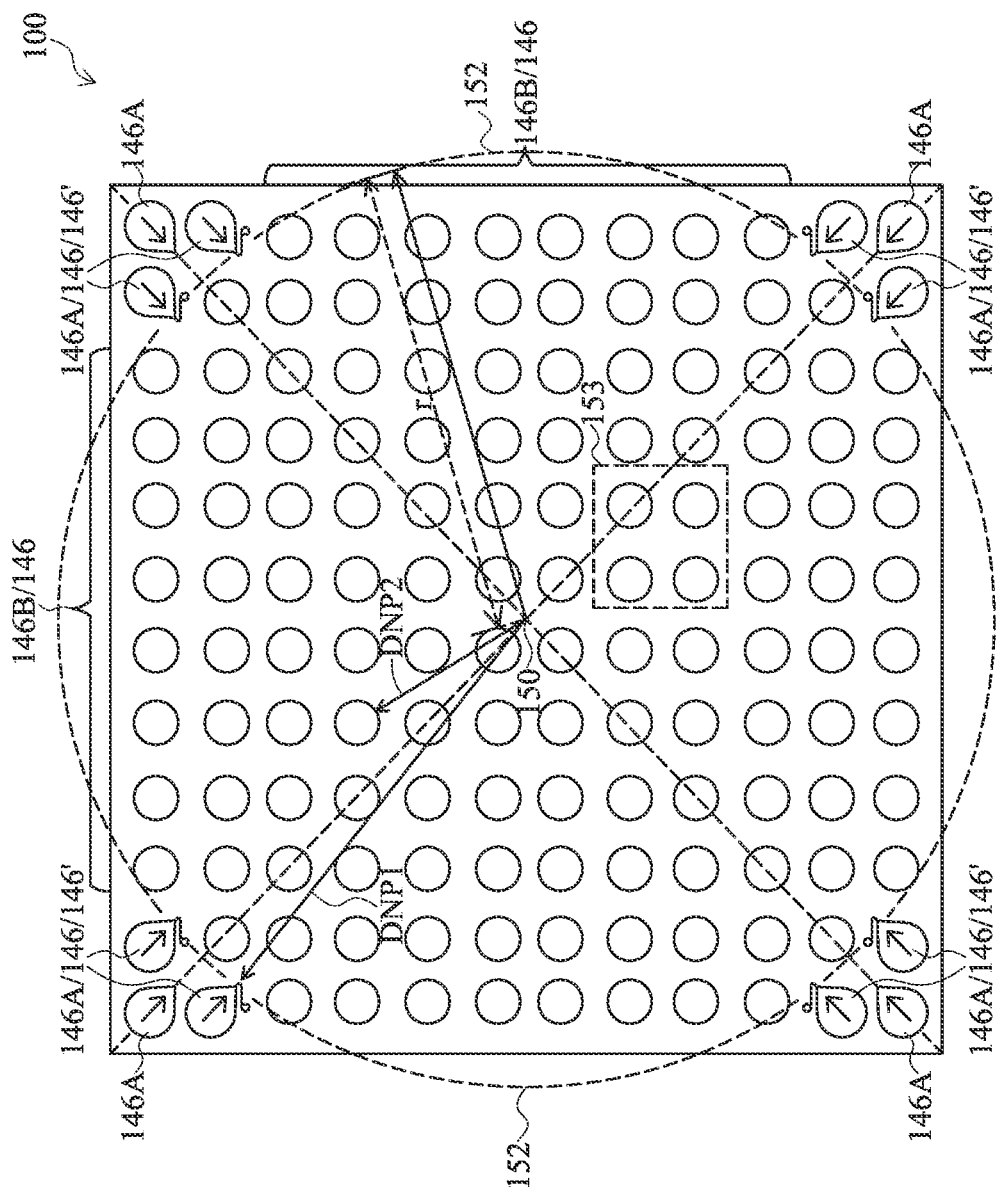

FIG. 4 also illustrates the bottom view of bottom package 100 and RDL pads 146 in accordance with alternative embodiments. In the bottom view, bottom package 100 has neutral-stress point 150, which is the point that is substantially free from stresses from all lateral directions that are parallel to the bottom surface of package 100. At neutral-stress point 150, the lateral stresses from opposite directions are cancelled out. In some embodiments, neutral-stress point 150 is at or close to the center (also marked as 150) of bottom package 100 (in the bottom view). The distance of each of RDL pads 146 to neutral-stress point 150 is referred to as a Distance to Neutral Point (DNP), wherein the distance to the RDL pads 146 may be measured from a point of the RDL pad 146 that is farthest to neutral-stress point 150. For example, DNPs DNP1 and DNP2 are illustrated as examples in FIG. 4.

Referring to FIGS. 3 and 4, circle 152 is drawn with the neutral-stress point 150 as the center, wherein circle 152 has radius r. In accordance with the embodiments of the present disclosure, all RDL pads 146 with the DNPs equal to or smaller than radius r may be designed as randomly-pointed RDL pads 146B, and all RDL pads 146 with DNPs greater than radius r are designed to be center-facing pads 146A. Some or all RDL pads 146 with the DNPs equal to or smaller than radius r may also be designed as center-facing pads 146A. As illustrated in FIG. 3, if radius r is large, then the center-facing pads 146A may only include a single corner RDL pad 146 at each corner 148. In FIG. 4, radius r is reduced, and more corner RDL pads 146 are designed as center-facing pads 146A, while the RDL pads 146 with the DNPs equal to or smaller than radius r are randomly pointed, and do not necessarily point to the center 150. The optimum radius r of circle 152 may be determined by simulation or experiment (by forming physical chips), so that the reliability of the RDLs 146 inside the circle 152 meets design specification.

In FIG. 4, the center-facing pads 146A at the same corner may have their bird-bird directions parallel to each other. This means that the bird-beak directions of some of center-facing pads 146A (marked as 146A') are actually slightly offset from the center 150. In alternative embodiments, all center-facing pads 146A at the same corner 148 may have bird-beak directions pointing right at center 150 of package 100, which means that their bird-beak directions are substantially, but not exactly, parallel to each other.

Figure 6:
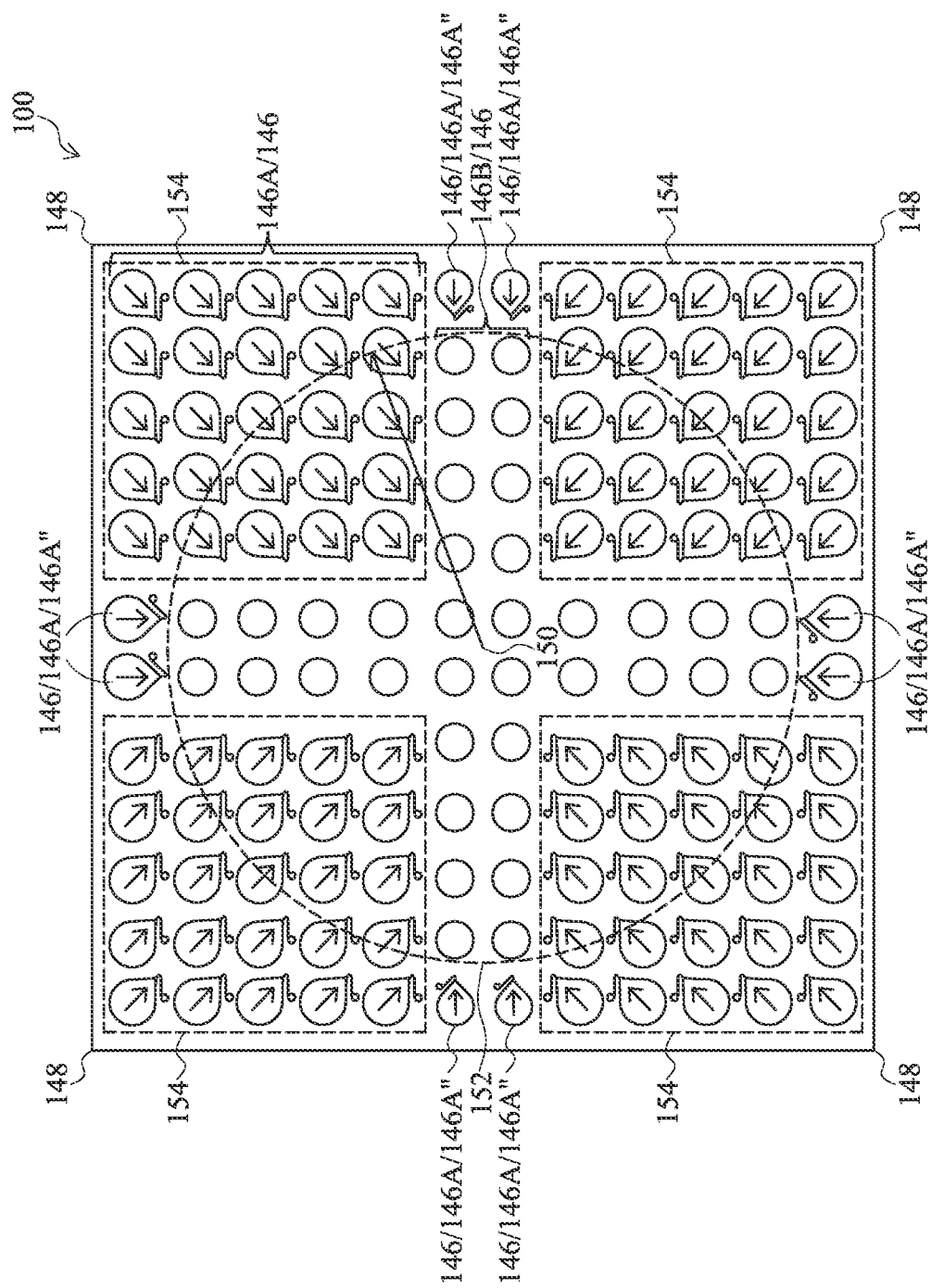
FIG. 6 illustrates a bottom view of a package and RDL pads in accordance with some embodiments, wherein center-facing pads are formed in rectangular corner regions of the package.

FIG. 6 illustrates the design of RDL pads 146 in accordance with yet alternative embodiments. In these embodiments, four corner regions 154 of bottom package 100 are defined, each extending from one of corners 148 inwardly. The four corner regions 154 may have rectangular shapes, and may have sizes the same as each other. The RDL pads 146 inside corner regions 154 are designed as center-facing pads 146A. The RDLs outside corner regions 154 may be designed as randomly-pointed RDL pads 146B, or may be designed as center-facing pads 146A.

In some embodiments as in FIG. 6, circle 152 is also drawn according to simulation or experiment results. The radius of circle 152 may be small, and hence some of RDL pads 146 that are outside of corner regions 154 are also outside of circle 152. Accordingly, as shown in FIG. 6, some of RDL pads 146 (marked as 146") that are outside of the circle 152 are also center-facing pads 146A, while the RDL pads 146 that are outside of corner regions 154, but inside circle 152, are randomly-pointed RDL pads 146B.

Figure 7:
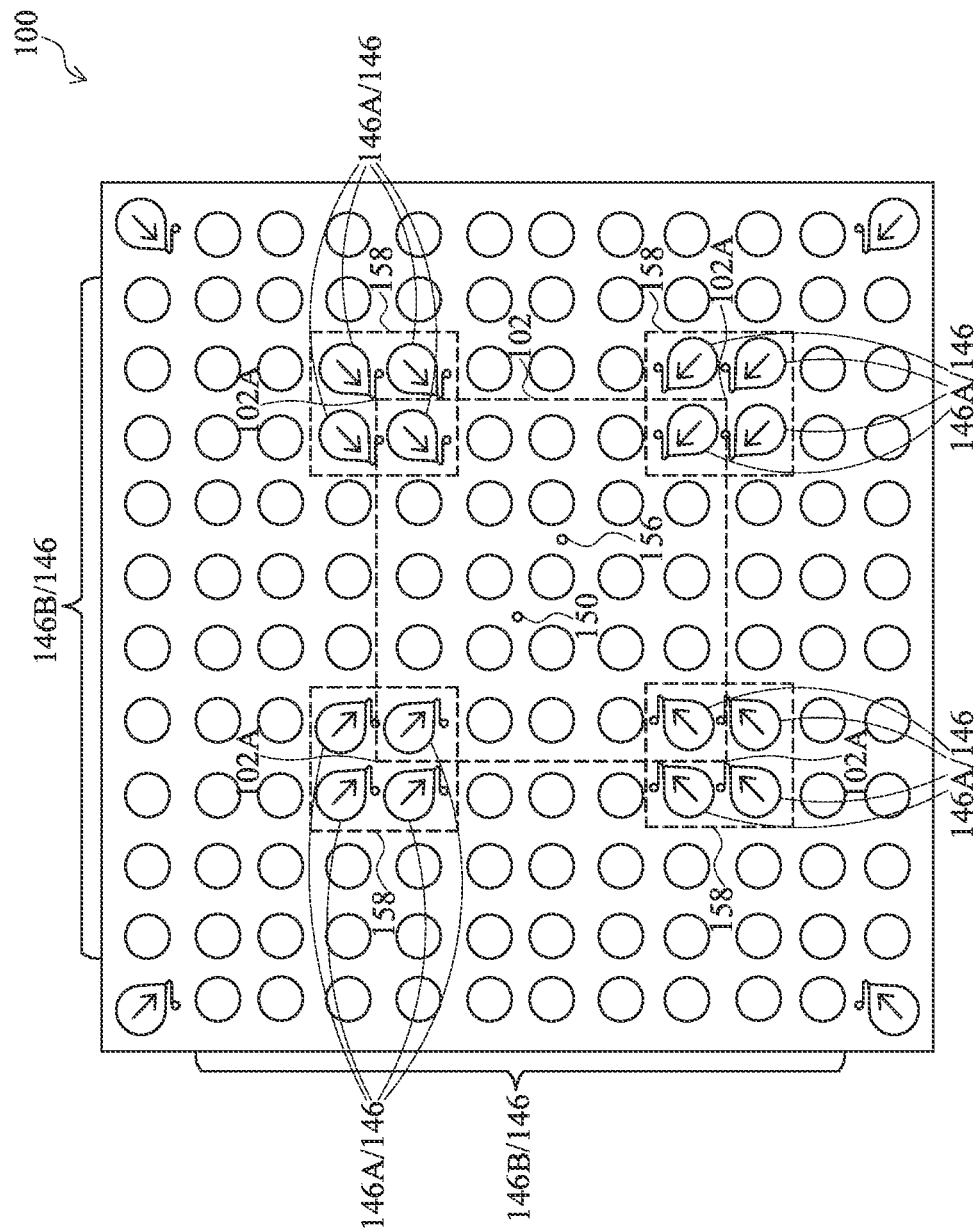
FIGS. 7 and 8 illustrate the bottom views of packages and RDL pads in accordance with some embodiments, wherein the corner RDL pads adjacent to the corners of device dies have bird-beak directions pointing to the centers of the respective device dies.
Figure 8:
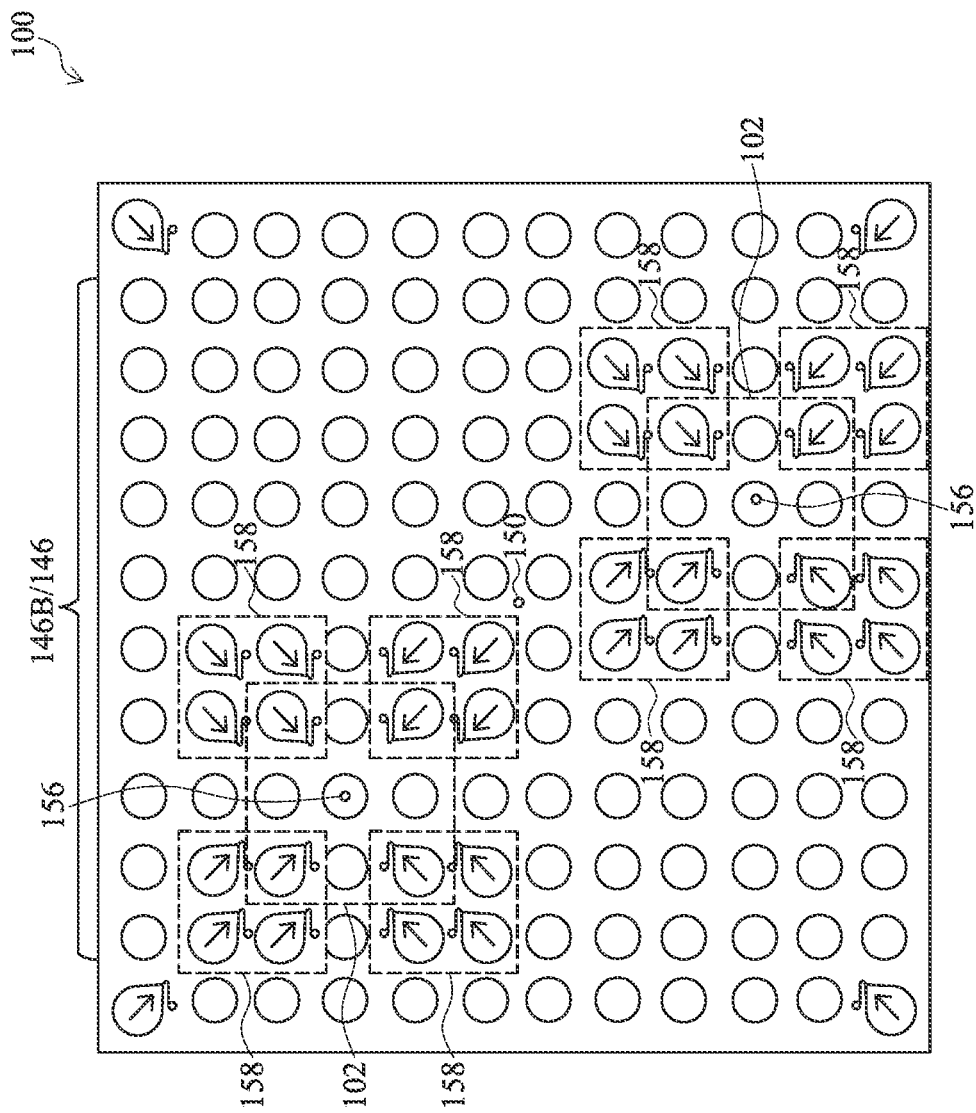

FIGS. 7 and 8 illustrate the bottom views of package 100 in the embodiments in which the RDL pads 146 adjacent to the corners of device die(s) 102 (FIG. 1) are also designed as center-facing pads 146A. These embodiments may be combined with the embodiments in FIGS. 3, 4, and 6, so that the center-facing pads 146A as shown in FIGS. 3, 4, and 6 may also be designed as center-facing pads 146A, in additional to the RDL pads 146A adjacent to the corners of device die(s) 102.

Referring to FIG. 7, device die 102 is illustrated. Device die 102 includes corners 102A. At each of corners 102A, device die 102 overlaps (Refer to FIG. 1) at least a portion of one RDL pad 146A. The neighboring RDL pads 146 adjacent to corners 102A are designed as center-facing pads 146A, wherein the neighboring RDL pads 146 are referred to as corner RDL pads 146 hereinafter. The corner RDL pads 146 of device die 102, instead of having bird-beak directions pointing to the center 150 of package 100, have bird-beak directions pointing to center 156 of device die 102. The corner RDL pads 146, which are center-facing pads, may be fully surrounded by randomly-pointed RDL pads. Similarly, the corner RDL pads 146A close to the same corner of device die 102 may have their bird-beak directions parallel to each other, although the bird-beak directions may also point exactly to center 156, hence are substantially, but not exactly, parallel to each other. Hence, throughout the description, when an RDL pad 146 is referred to as "center-facing," the bird-beak direction of the RDL pad 146 may point to the center of the respective package, or the center of a device die, depending on where the RDL pad is located.

FIG. 8 illustrates the bottom view of package 100 in accordance with alternative embodiments. These embodiments are similar to the embodiments in FIG. 7, except that there are two device dies 102 disposed in bottom package 100. The corner RDL pads 146 that are adjacent to the corners of each of device dies 102 are designed as center-facing pads 146A. For each of the device dies 102, the respective corner RLD pads 146A have their bird-beak directions pointing to the center 156 of the respective device die 102.

FIGS. 9A through 9J are the exemplary embodiments for defining what are the corner RDL pads of the device dies. Throughout FIG. 9A through 9J, nine RDL pads 146 are illustrated, and are marked with sequence numbers range from 0 to 8, with the one with the sequence number 0 (referred to as the $0^{th}$ RDL pad 146 hereinafter) being the central one of the nine RDL pads 146. Furthermore, throughout FIGS. 9A through 9J, dx represents the X-direction distance from the center of the $0^{th}$ RDL pad 146 to the vertical edge 102B1 of device die 102, and dy represents the Y-direction distance from the center of the $0^{th}$ RLD pad 146 to the horizontal edge 102B2. Pitch P1 represents the pitches of neighboring RDL pads 146, which are, for example, the distances between the centers of the main pad region 138 (FIG. 2) of neighboring RDL pads 146. Furthermore, in subsequently recited equations, the value "a" represents the diameter of RDL pads 146, as shown in FIG. 2. In each of the FIGS. 9A through 9J, the RDL pads 146 in rectangular region 158 (referred to as corner region hereinafter) are defined as corner RDLs, and are designed as center-facing pads. Hence, the center-facing pads include the $0^{th}$, the 1st, the 2nd, and the $4^{th}$ RDL pads 146. The 1st, the 2nd, and the $4^{th}$ RDL pads 146 are the pads that are not overlapped by device die 102, and are closest to corner 102A. The remaining RDL pads 146 may be randomly-pointed RDL pads, which may include the $3^{rd}$, the $5^{th}$, the $6^{th}$, the $7^{th}$, and the $8^{th}$ RDL pads 146.

Figure 9A:
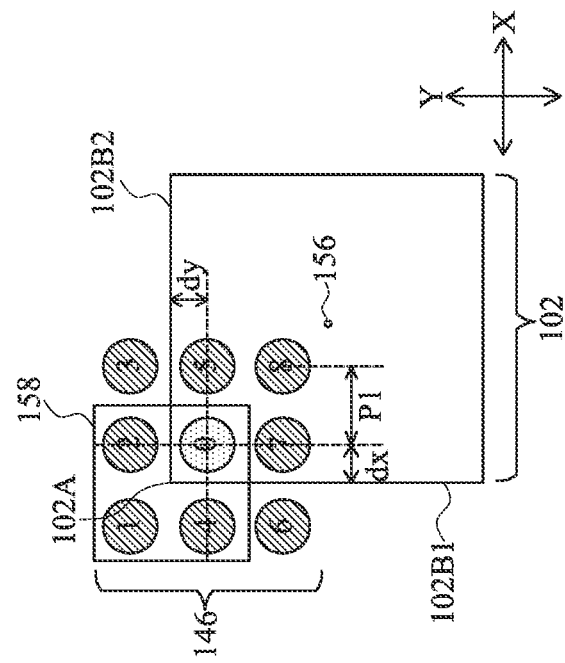
FIGS. 9A through 9J illustrate bottom views of some exemplary corner RDL pads with respective to the corners of the device dies.
Figure 9B:
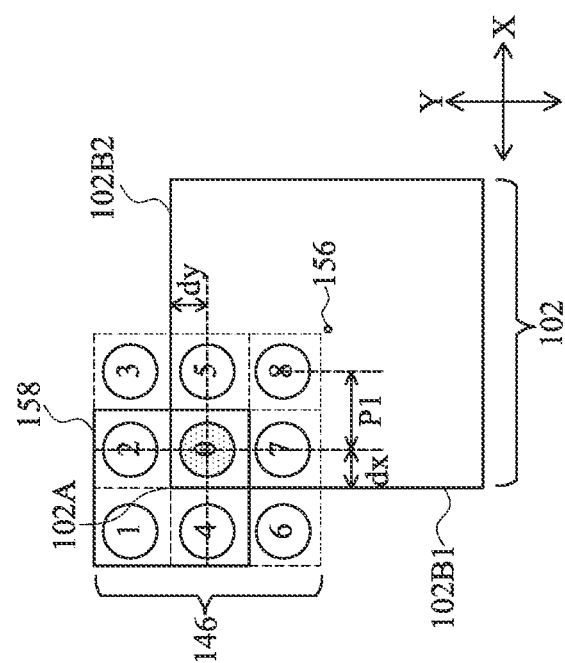
Figure 9D:
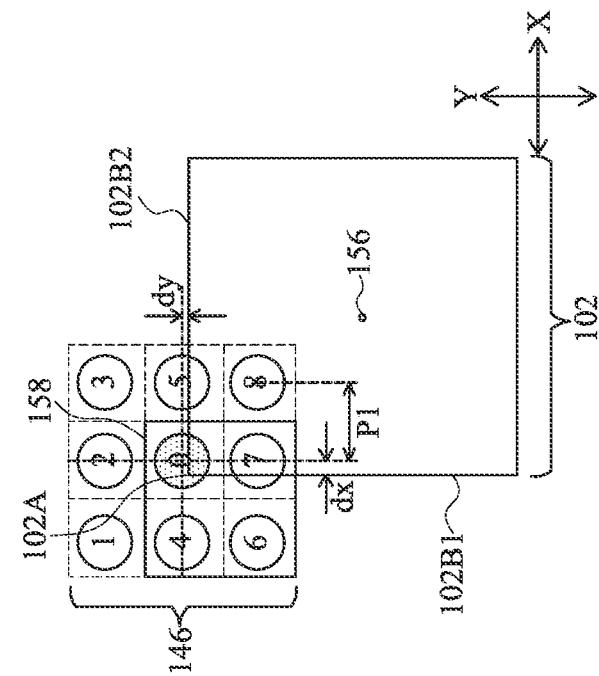
Figure 9C:
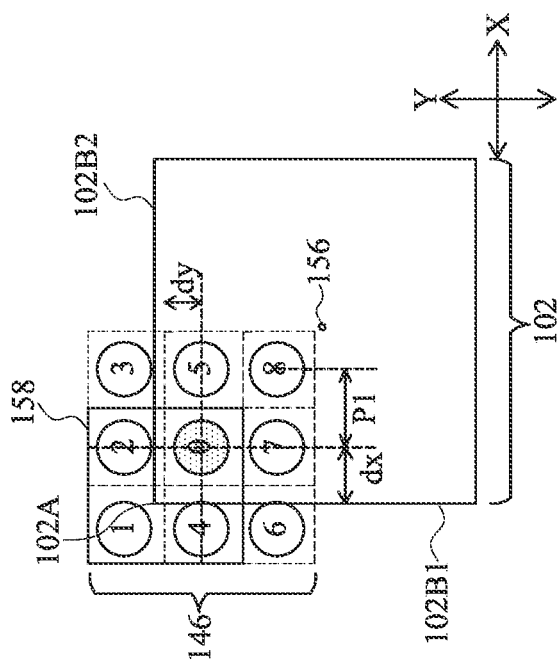

FIGS. 9A, 9B, and 9C illustrate the embodiments wherein the $0^{th}$ RDL pad 146 is fully overlapped by device die 102, and rest of the corner RDL pads 146 are not overlapped by device die 102. For example, if one of RDL pads 146 satisfies both of the following two relationships:

$$a/2 \le dx \le (P1-a/2) \quad \text{[Eq. 1]}$$

$$a/2 \le dy \le (P1-a/2) \quad \text{[Eq. 2]}$$

the respective RDL pad 146 is the $0^{th}$ RDL, and the respective corner region 158 and the RDL pads in the corner region 158 can be identified, as illustrated. In FIG. 9A, the $0^{th}$ RDL pad 146 does not have any point overlapped by edges 102B1 and 102B2. In FIG. 9B, the $0^{th}$ RDL pad 146 has a point aligned to edge 102B1, and the $0^{th}$ RDL pad 146 and device die 102 have no overlap. In FIG. 9C, dx is equal to (P1−a/2), which means that the $4^{th}$ RDL pad 146 has a point aligned to edge 102B1, and the $4^{th}$ RDL pad 146 and device die 102 have no overlap.

Figure 9E:
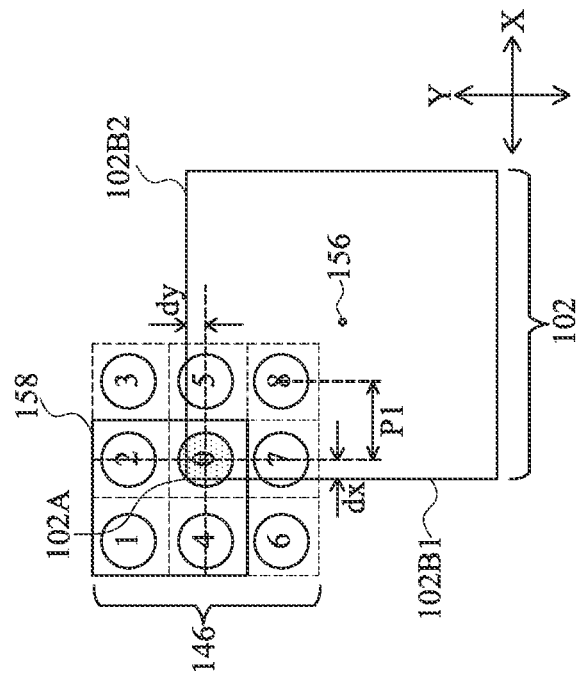
Figure 9F:
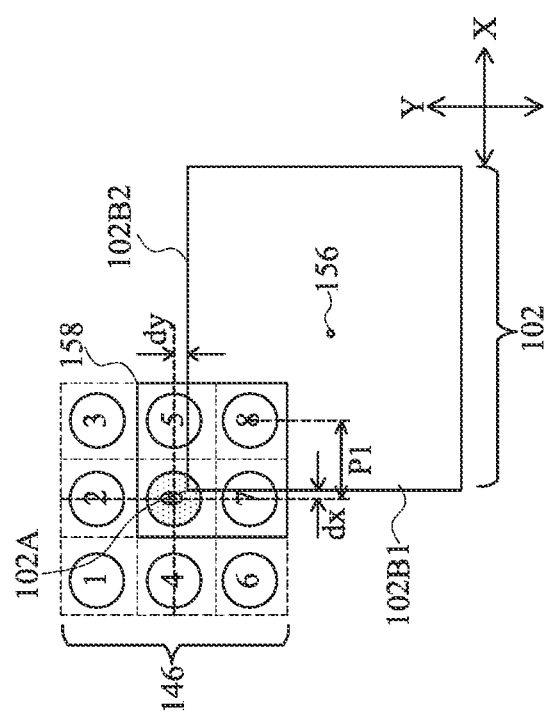

FIGS. 9D, 9E, and 9F illustrate the embodiments wherein the $0^{th}$ RDL pad 146 are partially overlapped by the respective device die 102. Furthermore, the corner 102A of device die 102 also overlaps the $0^{th}$ RDL pad 146. For example, if one of RDL pads 146 satisfies both of the following two relationships:

$$dx<a/2 \quad [\text{Eq. 3}]$$

$$dy<a/2 \quad [\text{Eq. 4}]$$

the respective RDL pads 146 is the $0^{th}$ RDL, and the respective corner region 158 and the RDL pads in the corner region 158 can be identified. In FIGS. 9D and 9E, the centers of the $0^{th}$ RDL pad 146 are not overlapped by the respective device dies 102. In FIG. 9F, the center of the $0^{th}$ RDL pad 146 is overlapped by device die 102.

Figure 9G:
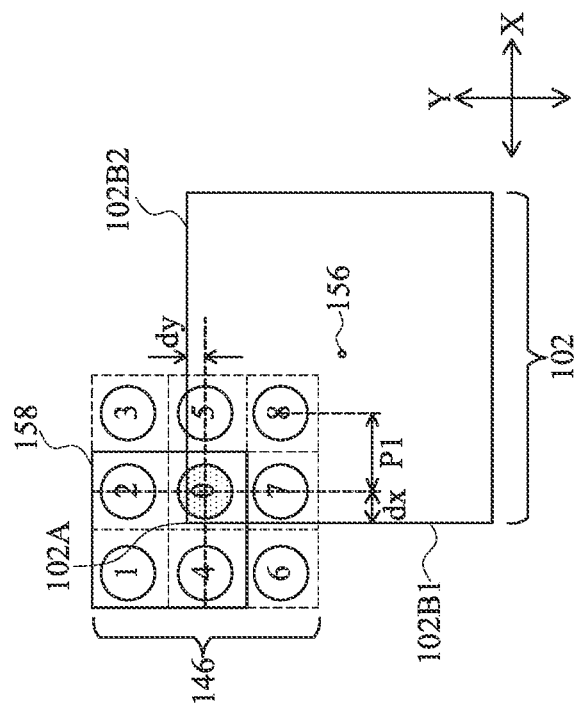
Figure 9H:
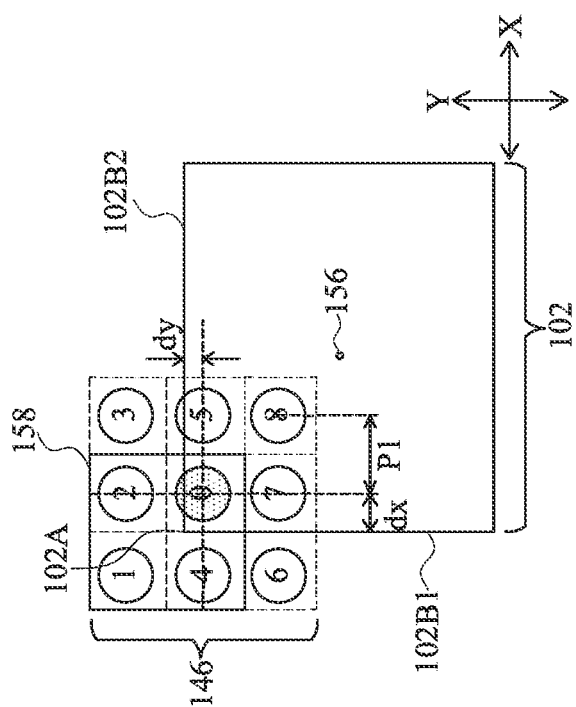
Figure 9J:
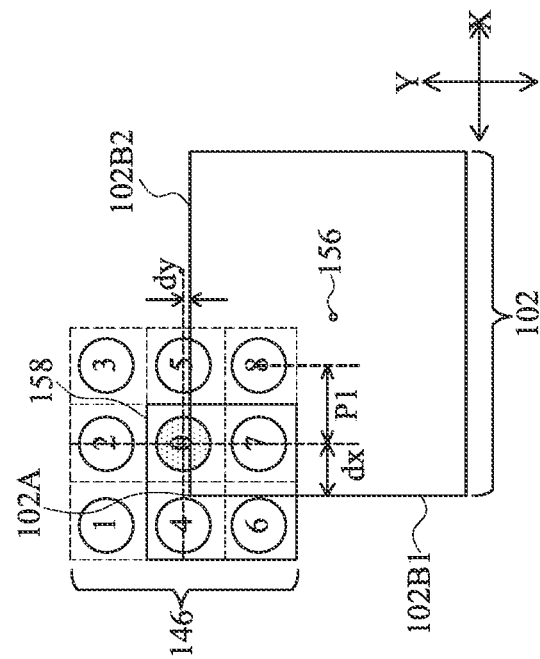
Figure 9I:
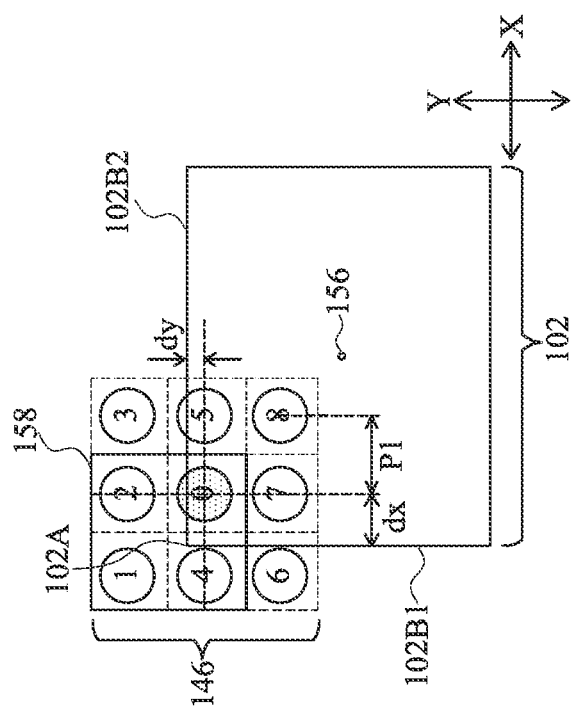

FIGS. 9G through 9J illustrate the embodiments wherein the $0^{th}$ RDL pad 146 is partially overlapped by device die 102. Furthermore, edge 102B2 overlaps the $0^{th}$ RDL pad 146, while the corner 102A of device die 102 does not overlap the $0^{th}$ RDL pad 146. For example, if one of RDL pads 146 satisfies both of the following two relationships:

$$a/2 \leq dx \leq (P1-a/2) \quad [\text{Eq. 5}]$$

$$dy<a/2 \quad [\text{Eq. 6}]$$

the respective RDL pads 146 is the $0^{th}$ RDL pad, and the respective corner region 158 and the RDL pads in the corner region 158 can be identified. In FIGS. 9G, 9H, and 9I, the centers of the respective $0^{th}$ RDL pads 146 are overlapped by the respective device dies 102. Furthermore, FIGS. 9G, 9H, and 9I illustrate the embodiments in which dx is equal to, smaller than, and greater than, (P1)/2. In FIG. 9J, the center of the $0^{th}$ pad RDL pad 146 is not overlapped by device die 102.

The embodiments of the present disclosure have several advantageous features. The RDL pads that are close to the corners of package 100 and device die 102 suffer from high stresses, and hence the RDL traces of these RDL pads are more likely to be broken by the stresses. Experiment results and simulation results indicate that the center-facing pads are more reliable, and the stresses suffered by the traces connected to the center-facing pads are lower than the stresses suffered by the randomly-pointed RDL pads. Accordingly, by designing the RDL pads that suffer from higher stresses as center-facing, the reliability of the respective package is improved. On the other hand, the RDL pads suffer from low stresses may have their bird-beak directions pointing randomly to improve the flexibility in RDL routing.

In accordance with some embodiments of the present disclosure, a package includes a corner, a device die, a plurality of redistribution lines underlying the device die, and a plurality of metal pads electrically coupled to the plurality of redistribution lines. The plurality of metal pads includes a corner metal pad, wherein the corner metal pad is a center-facing pad having a bird-beak direction substantially pointing to a center of the package. The plurality of metal pads further includes a metal pad farther away from the corner than the corner metal pad, wherein the metal pad is a non-center-facing pad having a bird-beak direction pointing away from the center of the package.

In accordance with alternative embodiments of the present disclosure, a package includes at least one first dielectric layer, a first plurality of redistribution lines in the at least one first dielectric layer, a device die over and electrically coupled to the first plurality of redistribution lines, a molding material molding the device die therein, a through-via penetrating through the molding material, and at least one second dielectric layer over the device die. A second plurality of redistribution lines is in the at least one second dielectric layer. The second plurality of redistribution lines is electrically coupled to the first plurality of redistribution lines through the through-via. A plurality of metal pads is underlying the device die and electrically coupled to the second plurality of redistribution lines. The plurality of metal pads includes a first center-facing metal pad and a non-center-facing metal pad.

In accordance with yet alternative embodiments of the present disclosure, a package includes a plurality of dielectric layers, a plurality of redistribution lines in the plurality of dielectric layers, a device die over and electrically coupled to the plurality of redistribution lines, and a plurality of metal pads underlying and electrically coupled to the plurality of redistribution lines. The plurality of metal pads includes a corner metal pad, wherein the corner metal pad has a first bird-beak direction pointing to a first center of a package that includes the plurality of metal pads and the device die. The plurality of metal pads further includes an inner metal pad adjacent to a corner of the device die, wherein the inner electrical has a second bird-beak direction pointing to a second center of the device die. The plurality of metal pads also includes a plurality of non-center-facing metal pads surrounding the inner metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a first package comprising:
        a device die comprising:
            a topmost surface at a first vertical level;
            a bottommost surface at a second vertical level; and
            a first center in a top view of the first package;
        an encapsulant encapsulating the device die therein;
        a plurality of redistribution lines over the device die;
        a first plurality of metal pads underlying the device die, wherein the first plurality of metal pads surround the device die in the top view of the first package, and the first plurality of metal pads comprise bird-beaks pointing to the first center of the device die, and wherein in the top view of the first package, the first package has a second center, and wherein the first center is offset from the second center; and
        a corner metal pad closest to a corner of the first package than all other metal pads in the first package, wherein the corner metal pad comprises an additional bird-beak pointing to the second center; and
    a second package bonding to the first package.

2. The structure of claim 1, wherein one of the bird-beaks of the first plurality of metal pads points to the first center, and further points toward a direction misaligned from the second center.

3. The structure of claim 1, wherein the additional bird-beak points in a direction misaligned from the first center.

4. The structure of claim 1, wherein the first plurality of metal pads comprise four metal pads, each pointing to a closest corner of the device die.

5. The structure of claim 1, wherein the first package further comprises a second plurality of metal pads forming an array, wherein the second plurality of metal pads comprise bird-beaks pointing to different directions.

6. The structure of claim 1 further comprising:
a plurality of under-metal-metallurgies (UBMs) in physical contact with the first plurality of metal pads; and
a plurality of solder regions in physical contact with the plurality of UBMs and the second package.

7. The structure of claim 6, wherein the first package further comprises a dielectric layer, wherein each of the plurality of UBMs comprises a first portion in the dielectric layer, and a second portion outside of the dielectric layer.

8. The structure of claim 1 further comprising a third package, wherein the second package and the third package are bonded to opposite sides of the first package.

9. The structure of claim 1 further comprising an additional device die comprising an additional center, wherein the additional device die is encapsulated in the encapsulant, and wherein both of the device die and the additional device die are electrically connected to the second package.

10. The structure of claim 1, wherein the first center has equal distances from four corners of the device die, and the second center has equal distances to four corners of the first package.

11. A structure comprising:
a device die comprising a first center;
an encapsulant encapsulating the device die therein;
a first plurality of metal pads comprising:
a plurality of corner pads underlying and vertically offset from the device die, wherein the first plurality of metal pads comprise a metal pad immediately neighboring a corner of the device die, and in a top view of the structure, the metal pad comprises a bird-beak pointing to both of the corner of the device die and the first center of the device die; and
a second plurality of metal pads underlying and overlapped by the device die, wherein at the corner of the device die, the second plurality of metal pads comprises an additional metal pad comprising an addition bird-beak, and in the top view of the structure, the additional bird-beak points to the first center of the device die.

12. The structure of claim 11 comprising a package, with the device die and the first plurality of metal pads being in the package, wherein in the top view, the package comprises a second center spaced apart from the first center.

13. The structure of claim 12, wherein the bird-beak of the metal pad does not point to the second center.

14. The structure of claim 11, wherein each of the plurality of corner pads comprises a round portion and a corresponding bird-beak, and a first end of the bird-beak is joined to the round portion, and a second end of the corresponding bird-beak is joined to a metal trace.

15. The structure of claim 11 further comprising a conductive through-via penetrating through the encapsulant.

16. A structure comprising:
a device die; and
a plurality of metal pads below the device die, wherein the plurality of metal pads comprise:
an array of metal pads comprising a first plurality of rows and a first plurality of columns of metal pads, wherein the array of metal pads comprises:
a first metal pad overlapped by the device die, wherein the first metal pad comprises a first round portion and a first bird-beak; and
a second metal pad vertically offset from the device die, wherein the first metal pad and the second metal pad are immediately neighboring to each other, wherein the second metal pad comprises a second round portion and a second bird-beak, and both of the first bird-beak and the second bird-beak point to a center of the device die in a top view of the structure.

17. The structure of claim 16, wherein the second bird-beak points to both of the first metal pad and a corner of the device die, and wherein the corner is between the first metal pad and the second metal pad.

18. The structure of claim 16 further comprising a third metal pad and a fourth metal pad forming a 2×2 array with the first metal pad and the second metal pad, wherein bird-beak directions of the third metal pad and the fourth metal pad are parallel to pointing-directions of the first bird-beak and the second bird-beak.

19. The structure of claim 16 further comprising a package that comprises the device die and the plurality of metal pads, wherein in the top view of the structure, the package comprises a package center offset from the center of the device die.

* * * * *